(12) United States Patent
Tsai

(10) Patent No.: US 7,796,379 B2
(45) Date of Patent: Sep. 14, 2010

(54) ELECTRONIC DATA STORAGE DEVICE STRUCTURE

(75) Inventor: Feng-Mi Tsai, Chung Ho (TW)

(73) Assignee: A-Data Technology Co., Ltd., Taipei (TW)

( * ) Notice: Subject to any disclaimer, the term of this patent is extended or adjusted under 35 U.S.C. 154(b) by 14 days.

(21) Appl. No.: 12/292,052

(22) Filed: Nov. 12, 2008

(65) Prior Publication Data

US 2009/0147461 A1  Jun. 11, 2009

Related U.S. Application Data

(60) Provisional application No. 60/996,833, filed on Dec. 7, 2007.

(51) Int. Cl.
*H05K 5/00* (2006.01)
*H05K 7/00* (2006.01)

(52) U.S. Cl. .............................. 361/679.32; 361/679.31
(58) Field of Classification Search ............ 361/679.32, 361/679.31
See application file for complete search history.

(56) References Cited

U.S. PATENT DOCUMENTS

2004/0081025 A1*  4/2004  Chen ........................... 368/10

* cited by examiner

*Primary Examiner*—Jayprakash N Gandhi
*Assistant Examiner*—Anthony M Haughton
(74) *Attorney, Agent, or Firm*—Rosenberg, Klein & Lee

(57) ABSTRACT

An electronic data storage device structure comprises a casing, at least one electronic data storage device, and a cap. The casing has a receiving space and at least one opening, the electronic data storage device is plugged into the opening, the cap is coupled with the casing, and the cap covers up the receiving space. Thereby, the electronic data storage device can store electronic data, and the receiving space can accommodate some beautiful or functional things.

11 Claims, 5 Drawing Sheets

ELECTRONIC DATA STORAGE DEVICE STRUCTURE

REFERENCE TO RELATED APPLICATION

This Patent Application is based on Provisional Patent Application Ser. No. 60/996,833 filed 7 Dec. 2007, currently pending.

BACKGROUND OF THE INVENTION

1. Field of the Invention

The present invention relates to an electronic data storage device, particular to a multifunction structure of the electronic data storage device.

2. Description of Related Art

FIGS. 1 and 2 show a conventional electronic data storage device, which includes a casing 1a, a plug 2a, and a protective cover 3a. The interior of the casing 1a has a circuit board (not shown), and the interior of the protective cover 3a has an accommodating space. When the plug 2a is inserted into a connecting port of a computer, the electronic data can be transmitted between the storage device and the computer. If the storage device is not used, the plug 2a can be inserted into the accommodating space of the protective cover 3a.

Although the data storage device has been used in popular, but few users have a good habit to receive the data storage device in an adequate place so that they lose the data storage device easily.

SUMMARY OF THE INVENTION

One particular aspect of the present invention is to provide an electronic data storage device. It is a multifunction structure so that it can store electronic data and receives functional things.

The electronic data storage device structure comprises a casing which has a receiving space and at least one opening, at least one electronic data storage device which is plugging into the opening, and a cap, coupled with the casing, covers up the receiving space.

The present invention has the following characteristics. The electronic data storage device which comprises semiconductor memory like RAM, ROM, Flash or etc. can store electronic data. A user can put some beautiful or functional things into the receiving space, such as photos, notepapers, or a lens. If the cap is transparent material, the casing can be used as a photo frame or a mirror. When the cap covers up the receiving space, the user can avoid losing and damaging things being inside the receiving space. If the user wants to get things being inside the receiving space, the user only needs to remove the cap which has covered up the receiving space.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF PREFERRED EMBODIMENTS

Figure 1:
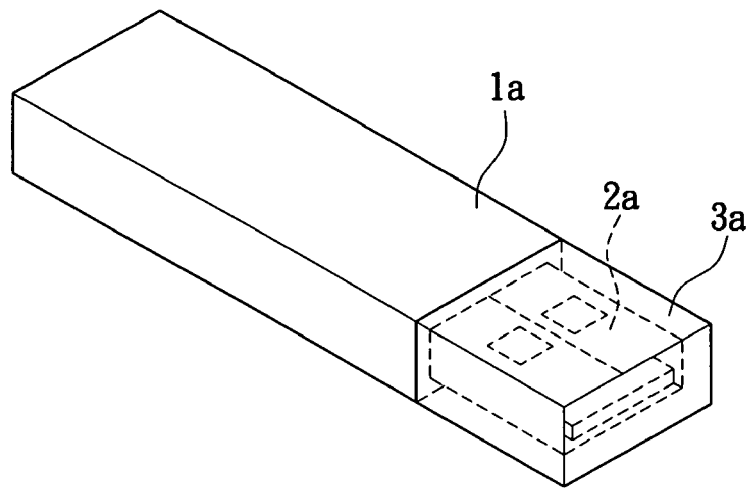
FIG. 1 is an assembly perspective view of the conventional electronic data storage device.
Figure 2:
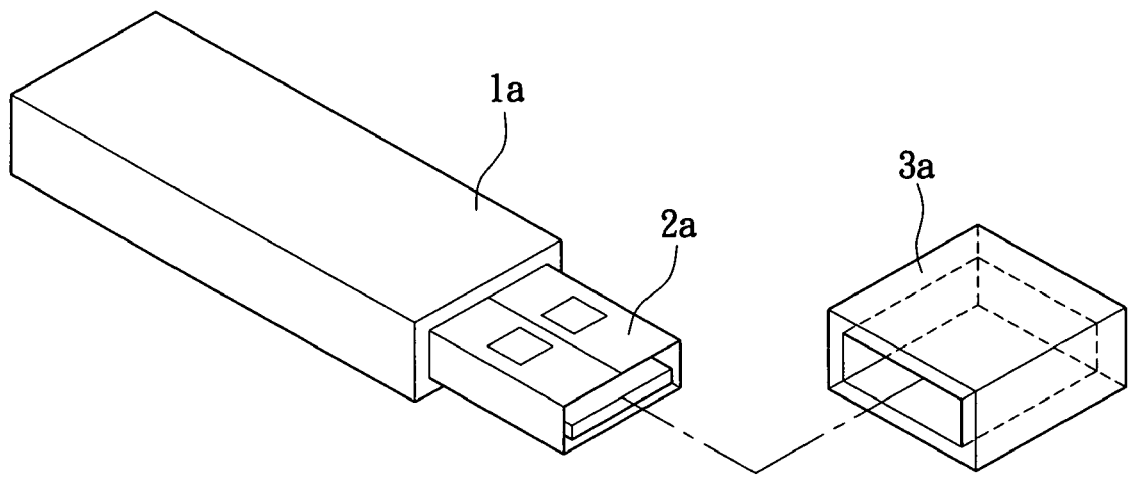
FIG. 2 is a service condition diagram of the conventional electronic data storage device.
Figure 3:
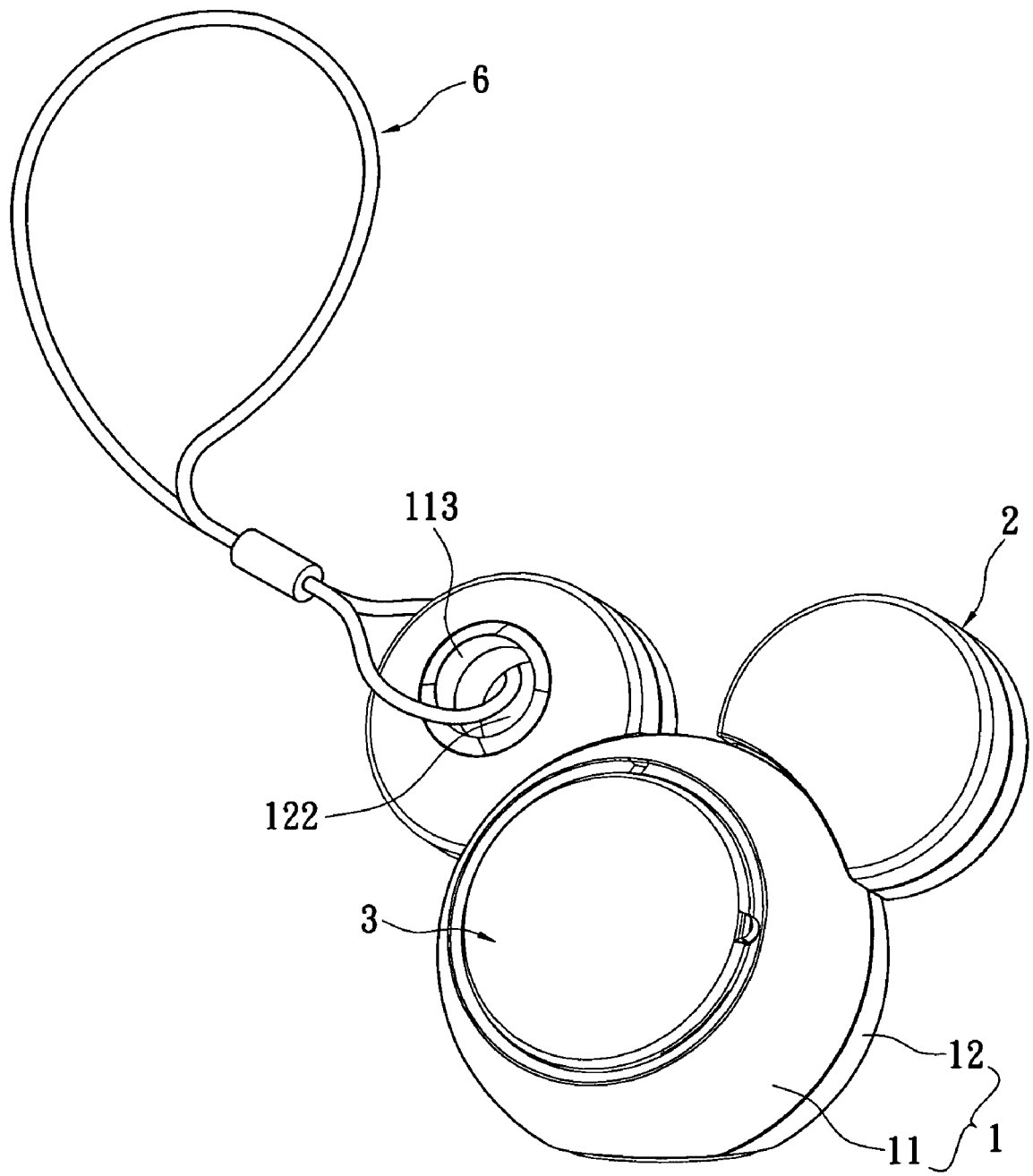
FIG. 3 is a perspective view of the electronic data storage device structure of the present invention for coupling with a mobile phone ripe.
Figure 4:
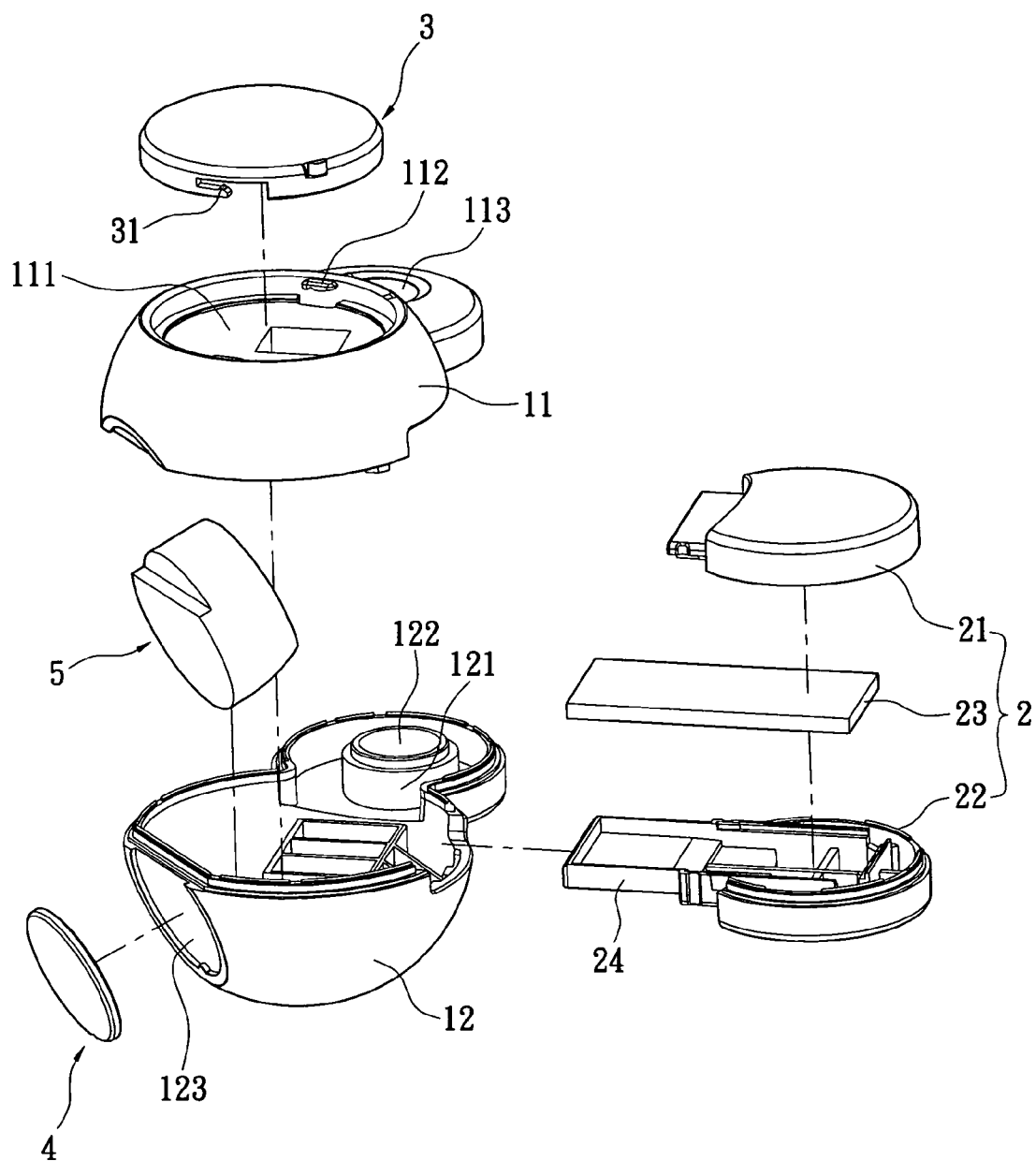
FIG. 4 is an exploded perspective view of the electronic data storage device structure of the present invention.

As shown in FIGS. 3 and 4. The electronic data storage device includes a housing 1, an electronic data storage device 2, and a cap 3. The housing 1 includes a top cover 11 and a bottom cover 12, the top cover 11 clips with the bottom cover 12, and an exterior of the top cover 11 has a receiving space 111. A first connecting portion 112 is a protruding block, and is located at an inside wall of the receiving space 111. The top cover 11 has a first through hole 113, a round stub 121 is formed inside the bottom cover 12, the round stub 121 has a second through hole 122, and the second through hole 122 is respective to the first through hole 113. The top cover 11 clips with the bottom cover 12 to form the casing 1, and a side of the casing 1 forms an opening 13.

A side of the casing 1 has a bottom portion 123, a gasket 4 is fixed with the bottom portion 123, a block 5, coupled with the bottom portion 123, is put into the interior of the casing 1. Furthermore, the block 5 presses on an inner surface of the gasket 4. The block 5 has a suitable weight, so that the casing 1 can stand stably. The block 5 can be a magnetic material, so that the casing 1 can attach with a note board or a chalkboard.

As shown in FIGS. 3 and 4. The electronic data storage device 2 includes a top cap 21, a bottom cap 22, a circuit board 23, and a base 24. The base 24 is mounted on the bottom cap 22, the circuit board 23 is fixed on the base 24, and the top cap 21 clips with the bottom cap 22. A portion of the circuit board 23 and a portion of the base 24 extend outside the top cap 21 and the bottom cap 22 to form an electric plug, and the electric plug of the electronic data storage device 2 inserts into the opening 13.

A user can get a mobile phone string 6 or a necklace to penetrate the first through hole 113 of the top cover 11 and the second through hole 122 of the bottom cover 12, so that the electronic data storage device structure becomes as a beautiful accouterment. In another embodiment of the present invention, the first through hole 113 and the second through hole 122 are replaced with another opening which another electronic data storage device can plug into, so that there are two electronic data storage devices coupling with the casing 1.

The cap 3 can be a transparent material, and the user can see the interior of the receiving space 111 clearly. The cap 3 has a second connecting portion 31, and the seconding connecting portion 31 is hook. The cap 3 couples with the top cover 11, the second connecting portion 31 hooks the first connecting portion 112 of the top cover 11, and the cap 3 covers up the receiving space 111.

Figure 5:
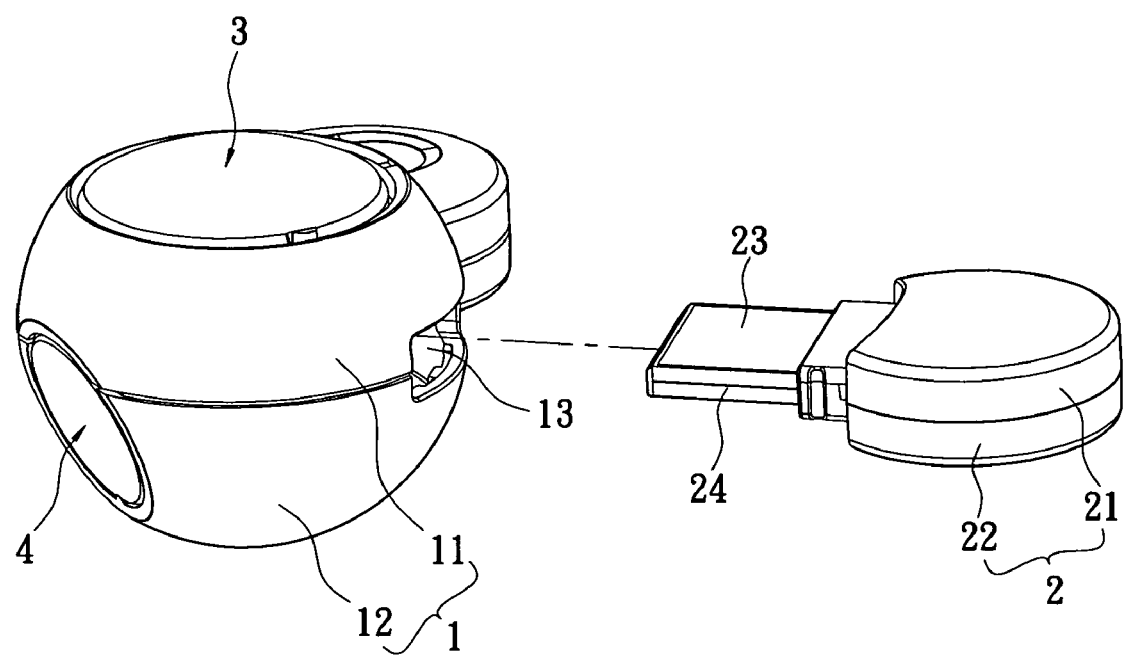
FIG. 5 is a first service condition diagram of the electronic data storage device structure of the present invention.

As shown in FIG. 5. When the user wants to use the electronic data storage device 2, the user firstly pulls out the electronic data storage device 2 which has been inserted into the opening 13, and inserts the electric plug of the electronic data storage device 2 into a connecting port of a computer, so that electronic data can be a transmitted between the electronic data storage device 2 and the computer.

Figure 6:
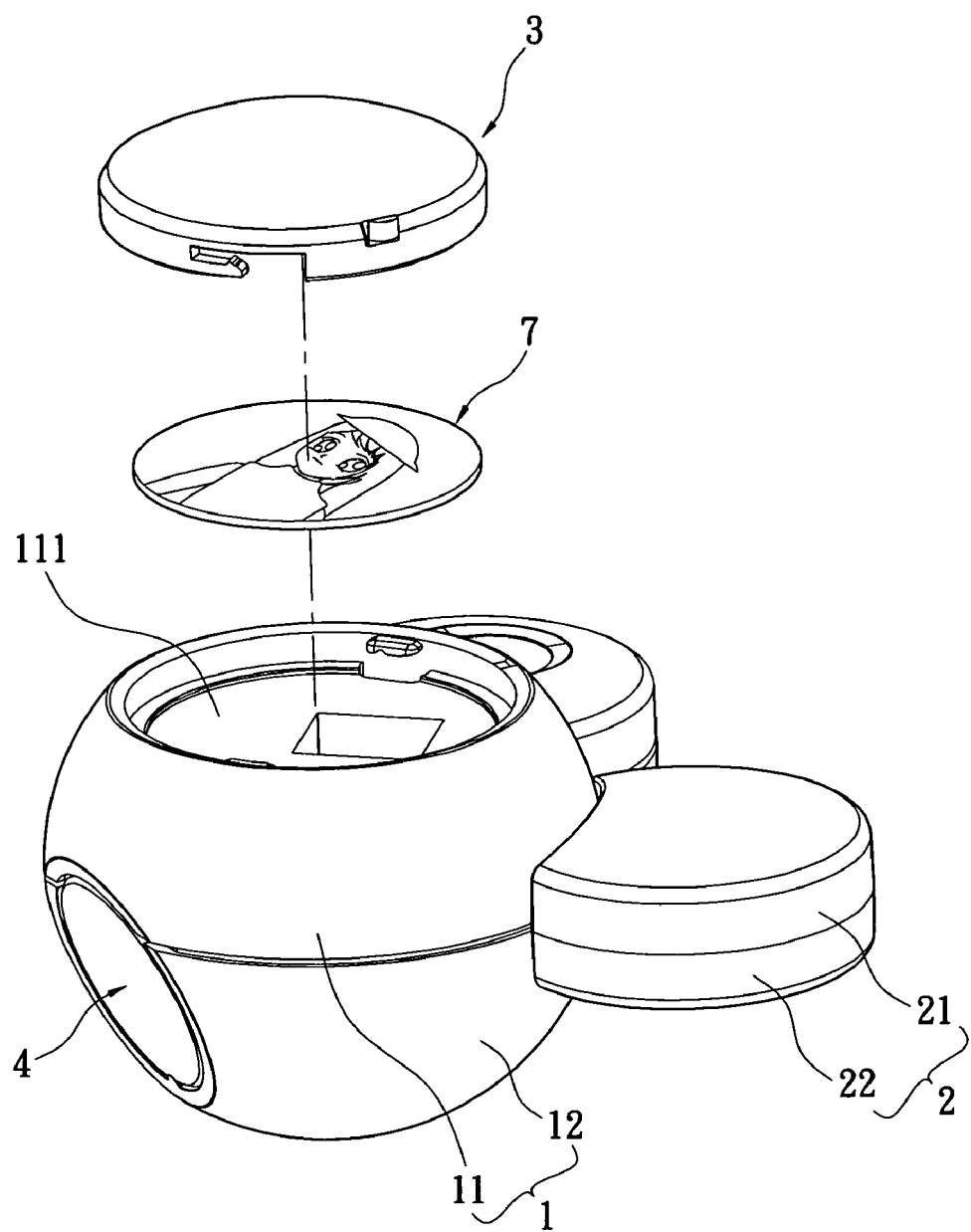
FIG. 6 is a second service condition diagram of the electronic data storage device structure of the present invention.

As shown in FIG. 6. The user can put some beautiful or functional things into the receiving space 111 of the top cover 11, such as photos 7, notepapers, or a lens. If the cap 3 is transparent material, the casing 1 can be used as a photo frame or a mirror. When the cap 3 covers up the receiving space 111, the user can avoid losing and damaging things being inside the receiving space 111. If the user wants to get things being inside the receiving space 111, the user only needs to remove the cap 3 which has covered up the receiving space 111.

The present invention has the following characteristics:

1. The electric plug of the electronic data storage device 2 can be inserted into a connecting port of a computer, so that electronic data can be transmitted between the electronic data storage device 2 and the computer.

2. The user can put some beautiful or functional things into the receiving space 111 of the top cover 11.

3. When the cap 3 covers up the receiving space 111, the user can avoid losing and damaging things being inside the receiving space 111.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An electronic data storage device, comprising:
   a casing, said casing having a top cover and a bottom cover, each of said top cover and said bottom cover having an integrally formed first and second receiving space in open communication respective each to the other, each of said first receiving spaces having a first through hole for receiving a string therethrough and each of said second receiving spaces having at least one opening;
   a data storage device, said data storage device including a base, said base releasably coupled to at least one of said opening of said second receiving spaces; and
   a cap, said cap being coupled to the second receiving space of said top cover to secure contents therein;
   wherein mating said top cover and said bottom cover forms a hollow casing that acts as a storage space that can be secured by said cap.

2. The electronic data storage device structure as claimed in claim 1, wherein the bottom cover of said casing has a bottom portion, and a gasket couples with the bottom portion.

3. The electronic data storage device structure as claimed in claim 1, wherein the bottom cover of said casing has a bottom portion, a block being mounted in an interior of the casing, and the block couples with the bottom portion.

4. The electronic data storage device structure as claimed in claim 3, wherein the block is made from magnetic material.

5. The electronic data storage device structure as claimed in claim 3, wherein the block has a suitable weight, enabling the housing to stand in a stable manner.

6. The electronic data storage device structure as claimed in claim 1, wherein the cap is made from transparent material.

7. The electronic data storage packing as claimed in claim 1, wherein the interior of the bottom cover protrudes a post, the post has a second through hole, and the second through hole is respective to the first through hole.

8. The electronic data storage packing as claimed in claim 7, wherein the string being a mobile phone rope.

9. The electronic data storage packing as claimed in claim 1, wherein the contents are photos, notepapers, or lens.

10. An electronic data storage device structure, comprising:
    a casing having a bottom portion, said casing having a top cover and a bottom cover, each of said top cover and said bottom cover having an integrally formed first and second receiving space in open communication respective each to the other, each of said first receiving spaces having a first through hole for receiving a string therethrough and each of said second receiving spaces having at least one opening; and
    a weighted block, said weighted block mounted in an interior of the casing, wherein the weighted block couples with the bottom portion;
    wherein the opening is positioned at a side of the casing for receiving an electronic device.

11. The electronic data storage packing as claimed in claim 10, wherein the top cover clips with the bottom cover, the top cover has a first through hole, a interior of the bottom cover protrudes a post, the post has a second through hole, and the second through hole is respective to the first through hole.

* * * * *